United States Patent
Safwat Mohamed Aboelenein Elmallah et al.

(10) Patent No.: US 12,451,900 B2
(45) Date of Patent: Oct. 21, 2025

(54) ANALOG ASSISTED FEED-FORWARD EQUALIZER

(71) Applicant: MediaTek Inc., Hsin-Chu (TW)

(72) Inventors: Ahmed Safwat Mohamed Aboelenein Elmallah, San Jose, CA (US); Ahmed Othman Mohamed Mohamed ElShater, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 208 days.

(21) Appl. No.: 18/477,471

(22) Filed: Sep. 28, 2023

(65) Prior Publication Data

US 2024/0146326 A1    May 2, 2024

Related U.S. Application Data

(60) Provisional application No. 63/381,944, filed on Nov. 2, 2022.

(51) Int. Cl.

| | |
|---|---|
| *H03M 1/66* | (2006.01) |
| *H03M 1/46* | (2006.01) |
| *H03M 1/80* | (2006.01) |
| *H04L 25/03* | (2006.01) |

(52) U.S. Cl.
CPC .......... *H03M 1/662* (2013.01); *H03M 1/462* (2013.01); *H03M 1/468* (2013.01); *H03M 1/802* (2013.01); *H03M 1/804* (2013.01); *H04L 25/03012* (2013.01)

(58) Field of Classification Search
CPC ...... H03M 1/662; H03M 1/462; H03M 1/802; H03M 1/468; H03M 1/804; H04L 25/03012
USPC .......... 341/144, 155, 161–163, 172
See application file for complete search history.

(56) References Cited

U.S. PATENT DOCUMENTS

| | | | |
|---|---|---|---|
| 11,522,556 B1 * | 12/2022 | Sheikholeslami .... | H03M 3/426 |
| 11,658,696 B2 * | 5/2023 | Pandita ................ | H03G 3/3042 |
| | | | 375/219 |

OTHER PUBLICATIONS

Frans, Adc-based wireline transceiver. 2019 IEEE Custom Integrated Circuits Conference (CICC). Apr. 14, 2019. 89 pages.

* cited by examiner

*Primary Examiner* — Khai M Nguyen
(74) *Attorney, Agent, or Firm* — Winston Hsu

(57) ABSTRACT

The techniques described herein relate to analog-assisted feed-forward equalizers. An example apparatus includes a first charge element digital-to-analog converter (DAC) including a first plurality of charge storage elements configured to store first samples of charge based on respective first portions of a digital input signal, and generate, based on the first samples, a first analog output signal proportional to the first portions. The apparatus further includes a second charge element DAC coupled to the first charge element DAC and including a second plurality of charge storage elements configured to store second samples of charge based on respective second portions of the digital input signal, and generate, based on the second samples, a second analog output signal proportional to the second portions, and wherein the coupling of the first and second outputs generates a third analog output signal based on a combination of the first and second analog output signals.

20 Claims, 10 Drawing Sheets

| Ctrim Coarse | Trim Fine | | | | | | | | | | | | | | | | Ctot |
|---|---|---|---|---|---|---|---|---|---|---|---|---|---|---|---|---|---|
| | 0 | 1 | 2 | 3 | 4 | 5 | 6 | 7 | 8 | 9 | 10 | 11 | 12 | 13 | 14 | 15 | |
| 1 | Coeff0 | | | | | | | ⋮ | | | | | | | | Coeff15 | |
| 0.5 | Coeff16 | | | | | | | ⋮ | | | | | | | | Coeff31 | |
| 0.25 | Coeff32 | | | | | | | ⋮ | | | | | | | | Coeff47 | |
| 0.125 | Coeff48 | | | | | | | ⋮ | | | | | | | | Coeff63 | |
| 0.0625 | Coeff64 | | | | | | | ⋮ | | | | | | | | Coeff79 | |
| 0.03125 | Coeff80 | | | | | | | ⋮ | | | | | | | | Coeff95 | |
| 0.015625 | Coeff96 | | | | | | | ⋮ | | | | | | | | Coeff111 | |

ANALOG ASSISTED FEED-FORWARD EQUALIZER

RELATED APPLICATION

This patent claims priority under 35 U.S.C. § 119(e) to U.S. Provisional Application No. 63/381,944, titled "ANALOG ASSISTED FEED-FORWARD EQUALIZER," filed on Nov. 2, 2022, which is hereby incorporated by reference herein in its entirety.

FIELD

The techniques described herein relate generally to communication channel equalization and, more particularly, to analog-assisted feed-forward equalizers.

BACKGROUND

Channel equalization is a process of conditioning an electrical signal, either at a transmitter or a receiver, to compensate for channel-induced inter-symbol-interference at the receiver and improve signal integrity. An exemplary channel equalization technique is feed-forward equalization, which may be used to reduce distortions of the communication channels implemented by the transmitter and the receiver due to channel loss impairments.

SUMMARY OF THE DISCLOSURE

In accordance with the disclosed subject matter, exemplary analog assisted feed-forward equalizers are provided.

Some embodiments relate to an apparatus for feed-forward equalization. The apparatus comprises a first charge element digital-to-analog converter (DAC) with a first output, the first charge element DAC comprising a first plurality of charge storage elements, the first charge element DAC being configured to: store first samples of charge based on respective first portions of a digital input signal; and generate a first analog output signal proportional to the first portions of the digital input signal and based on the first samples of charge; and a second charge element DAC with a second output coupled to the first output, the second charge element DAC comprising a second plurality of charge storage elements, the second charge element DAC being configured to: store second samples of charge based on respective second portions of the digital input signal; and generate a second analog output signal proportional to the second portions of the digital input signal and based on the second samples of charge; and wherein the first output and the second output are coupled at a node to combine the first analog output signal and the second analog output signal to generate a third analog output signal.

Some embodiments relate to another apparatus. The apparatus comprises a plurality of capacitor digital-to-analog converters (CDACs) with respective CDAC outputs, the plurality of CDACs configured to generate first analog output signals proportional to first portions of a digital input signal; a comparator circuit with a comparator input and a comparator output, the comparator input coupled to one or more of the respective CDAC outputs, the comparator circuit configured to determine whether respective ones of the first analog output signals satisfy a voltage threshold; successive approximation (SAR) logic with a SAR logic input and a SAR logic output, the SAR logic input coupled to the comparator output, the SAR logic configured to pass the comparator output and control sampling of the plurality of CDACs; digital logic with a digital logic output, the digital logic configured to generate a second analog output signal representative of a multiplication of second portions of the digital input signal and a coefficient; and an adder circuit with a first adder input and a second adder input, the first adder input coupled to the SAR logic output, the second adder input coupled to the digital logic output, and the adder circuit configured to output a sample of the digital input signal based on a combination of the first analog output signal and the second analog output signal.

Some embodiments relate to yet another apparatus. The apparatus comprises a receiver front end circuit configured to convert a first analog signal to a digital signal, the first analog signal associated with a first clock; a retimer circuit coupled to the receiver front end circuit, the retimer circuit configured to output a copy of the digital signal based on a second clock, different from the first clock; a plurality of capacitor digital-to-analog converters (CDACs) coupled to the retimer circuit, the plurality of CDACs configured to generate second analog signals proportional to portions of the digital signal; analog adder circuitry configured to generate a third analog signal based on a combination of ones of the second analog signals; and an analog-to-digital converter configured to output a sample of the digital signal based on the third analog signal.

The foregoing summary is not intended to be limiting. Moreover, various aspects of the present disclosure may be implemented alone or in combination with other aspects.

BRIEF DESCRIPTION OF FIGURES

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

FIG. 6 is a table of example coefficients.

DETAILED DESCRIPTION

Figure 1:
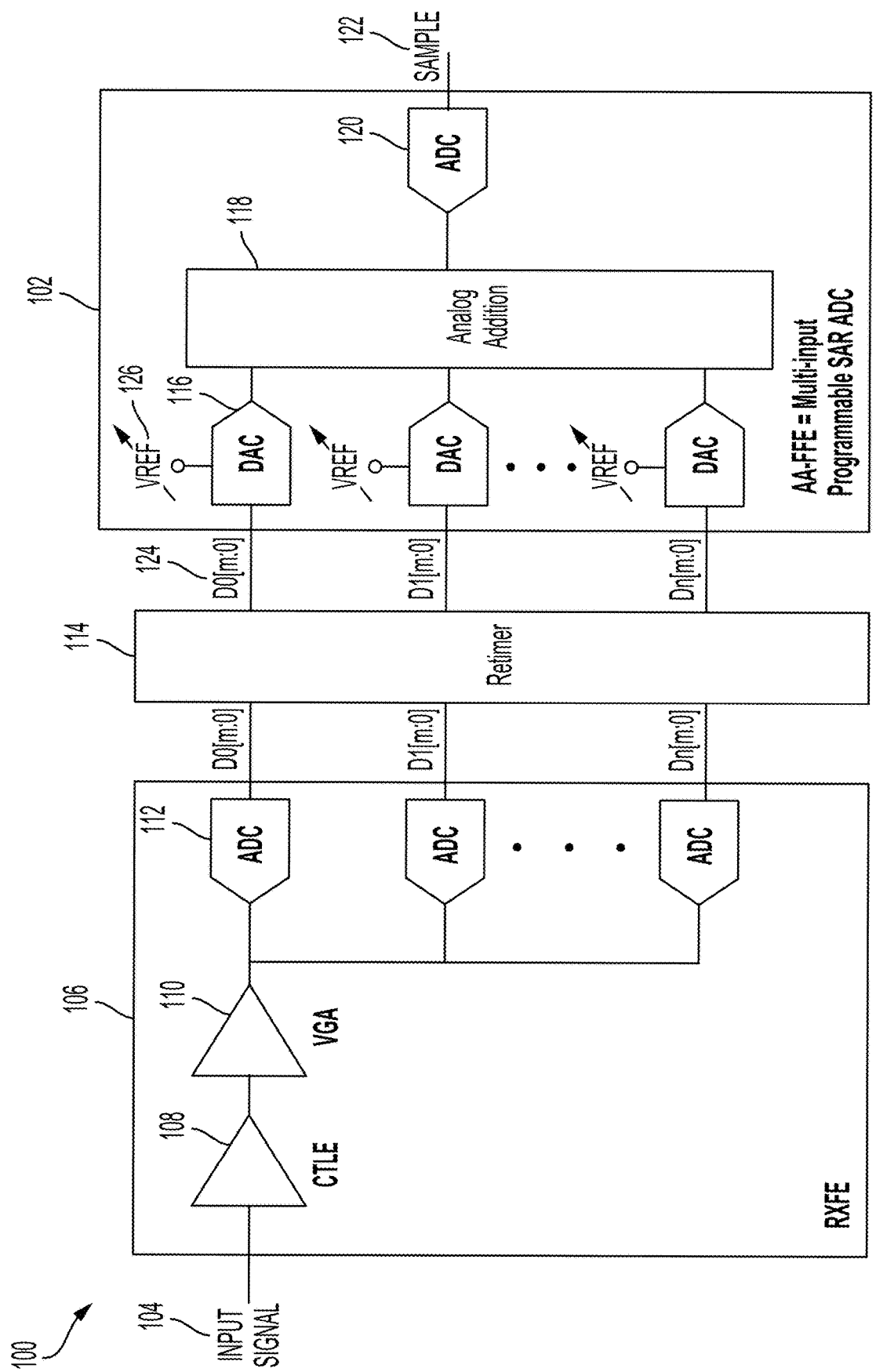
FIG. 1 depicts an example data receiver system including an example analog-assisted feed-forward equalizer, which includes a digital-to-analog converter.

Data communication refers to the transfer and reception of data in the form of a digitized analog signal, such as a digital bitstream, that is transmitted over a point-to-point or point-to-multipoint communication channel. In some instances, networked electronic devices may transmit data across a network via one or more other networked electronic devices. In other instances, data may be transmitted within the same device, such as between integrated circuits (ICs) on the same printed circuit board (PCB).

Data may be transmitted (e.g., across a network, within the same device, etc.) using a communication link implemented by a transmitter that generates a signal, a channel that carries the signal, and a receiver that receives and correctly decodes the contents and/or the data representations of the signal. Non-limiting examples of a channel that carries a signal includes a channel implemented over-the-air, via a copper medium, and via an optical fiber medium. To correctly decode the signal, the integrity of the signal needs to be maintained between the transmitter and the receiver. For example, if a logic high signal, such as a "1" or a digital "1", is sent from the transmitter and through the channel, the receiver should also determine that the signal is a "1". As data communication applications demand increased signaling speed, signal processing hardware and corresponding techniques are needed to maintain signal integrity.

Signal integrity of signals passing through a communication channel may be affected by a number of factors. Some factors include atmospheric and/or environmental noise, human-made noise, and the like. Other factors are deterministic in nature, such as signal transmission being affected by the limited bandwidth of the particular physical medium being used and crosstalk from adjacent channels. For example, the signal integrity associated with a communication channel implemented using copper-based signal transmission may be adversely affected by the limited bandwidth of the copper channels and crosstalk from adjacent copper channels. In some instances, the signal integrity associated with an optical communication channel may be affected due to frequency-independent loss of optical power as the optical signals travel through the fiber as well as dispersion-causing phenomena based on the type of fiber used. Such signal integrity issues may result in inter-symbol interference (ISI) at the receiver. ISI is a form of distortion of a signal in which one symbol interferes with subsequent symbols and may increase as the data rate and the length of the communication channel increases. A symbol may represent one or more digital bits as determined by a digital modulation format. For example, a symbol may be a waveform, a state, or a significant condition of a communication channel that persists for a fixed period of time.

Some receiver devices may use equalization techniques, such as channel equalization techniques, to maintain signal integrity of signals transmitted through a communication channel by cancelling and/or otherwise reducing ISI. Some such receiver devices may be implemented using an analog-to-digital converter (ADC) based receiver architecture, which allows for equalization techniques to be implemented. Equalization refers to the process of conditioning an electrical signal, either at the transmitter or the receiver, to compensate for channel-induced ISI. In particular, some ADC-based receiver architectures may use digital feed-forward equalization (FFE) techniques to reduce ISI.

FFE may be implemented by a filter (e.g., a linear filter, a digital finite impulse response (FIR) filter, etc.) that creates a number of delayed versions of an input signal and adds the delayed versions back to the input signal with the proper coefficients (e.g., weights). For example, a digital feed-forward equalizer can include multipliers implemented with digital logic to create the delayed versions by multiplying the input signal and respective coefficients. The digital FFE can include adders implemented with digital logic to add the delayed versions back to the input signal to output a sample of the input signal. Some FFE implementations include multiple-tap filters and multiple tap coefficients, with taps being either pre-cursor or post-cursor. The coefficients of those taps may be positive or negative depending on whether they are pre-cursor or post-cursor.

One challenge of using digital FFE to reduce ISI is latency. Digital FFE may use a large number of taps (e.g., 32 taps) (also referred to as delay elements) to achieve low ISI noise but the large number of taps causes substantially higher latency. For example, each of the taps may be implemented using digital logic that performs multiplication and/or addition operations using sequential operation (e.g., all inputs are needed to be available for evaluation), which causes the higher latency. Some digital FFE implementations may include a clock data recovery (CDR) circuit to recover an embedded clock in a received signal. However, CDR circuits are sensitive to latency, which limits a maximum bandwidth of the receiver. As a result of the substantially higher latency due to the sequential digital logic of the large number of taps, the CDR circuit may reduce the maximum bandwidth that is achievable by the receiver.

Some digital FFE implementations may use a pre-filter in a feedback path of the receiver to reduce the latency caused by the large number of FFE taps. One challenge of using the pre-filter is that the pre-filter introduces more ISI noise in the CDR circuit, which causes signal-to-noise ratio (SNR) degradation associated with the receiver.

Another challenge of using digital FFE in a receiver is that digital equalization, such as implementing multiplication and addition operations using digital logic, consumes a substantial portion of the receiver's power. Yet another challenge of using the digital FFE is that the digital logic consumes a substantial area portion of an IC and/or PCB on which the digital FFE is implemented.

The inventors have recognized that conventional receivers suffer from reduced bandwidth and increased latency, power consumption, and area consumption. The inventors have recognized that conventional equalization techniques, such as digital FFE techniques described above, do not overcome the aforementioned challenges. The inventors have developed technology to overcome the aforementioned challenges using exemplary analog-assisted feed-forward equalizers as disclosed herein.

Exemplary analog-assisted feed-forward equalizers disclosed herein are analog assisted because they can make use of digital data but perform arithmetic operations (e.g., multiplication operations, addition operations) in the analog domain. For example, the analog-assisted feed-forward equalizers disclosed herein can include digital-to-analog converters (DACs) to convert digital words to analog signals. The analog-assisted feed-forward equalizers can perform multiplication operations by scaling a reference voltage of the DACs to achieve instant multiplication with relatively small latency. Beneficially, the power consumed by the multiplication operations scales down at lower coefficients. The analog-assisted feed-forward equalizers can perform addition (e.g., addition operations) by adding the signals generated by the multiplication operations in the analog domain. For example, the analog-assisted feed-forward equalizers can perform charge and/or current signal addition and, beneficially, the addition can be performed concurrently with no latency.

In some embodiments, disclosed analog-assisted feed-forward equalizers may be implemented using a hybrid approach. For example, one or more cursors, which may include the main cursor, of the input signal can be processed with digital logic and other cursors of the input signal can be processed in the analog domain. Beneficially, cursors that have the largest amplitude terms may be removed from the ADC conversion to achieve a reduction in area while limiting adverse latency effects. For example, because most of the other cursors can be processed using the low-latency techniques of performing multiplication and addition operations in the analog domain, maintaining a few of the largest amplitude terms in the digital domain do not have an outsized adverse effect on latency.

Turning to the figures, the illustrated example of FIG. 1 depicts an example data receiver system 100 including an example analog-assisted feed-forward equalizer 102. In some embodiments, the analog-assisted feed-forward equalizer 102 is configured to perform channel equalization with reduced latency and ISI noise while maintaining a relatively low level of area and power consumption. For example, the analog-assisted feed-forward equalizer 102 is analog assisted because it can receive digital data and perform arithmetic operations (e.g., multiplication operations, addition operations) in the analog domain to output a sample of the digital data with reduced latency and ISI noise.

The data receiver system 100 of the illustrated example is a wireline receiver (e.g., a data communication wireline receiver) that can receive communication data, such as data represented by an input signal 104, through one or more wired connections. For example, the input signal 104 can be an analog signal representative of data transmitted through a communication channel. Non-limiting examples of wireline receivers include Ethernet interfaces, Peripheral Component Interconnect (PCI) interfaces, Serial Digital Interfaces (SDI), Universal Serial Bus (USB) interfaces, and High-Definition Multimedia Interfaces (HDMI). Alternatively, the data receiver system 100 may be a wireless receiver. Non-limiting examples of wireless receivers include Wireless Fidelity (Wi-Fi) receivers, Bluetooth receivers, near-field communication (NFC) receivers, radio-frequency identification (RFID) receivers, and satellite receivers (e.g., beyond-line-of-site (BLOS) satellite receivers, line-of-site (LOS) satellite receivers, etc.).

In some embodiments, the data receiver system 100 is included in an electronic device. Non-limiting examples of electronic devices include gateways, routers, switches, laptop computers, tablet computers, cellular phones (e.g., smartphones), televisions (e.g., smart televisions), set-top boxes, streaming devices, and wearable devices (e.g., headphones, headsets, smartwatches, smart glasses, etc.).

The data receiver system 100 includes a receiver front end 106 (identified by RXFE), which can be implemented by one or more receiver front-end circuits (e.g., receiver front end circuitry). The receiver front end 106 of this example includes a continuous time linear equalization (CTLE) circuit 108 (also referred to as a continuous time linear equalizer), a variable-gain amplifier (VGA) 110 (also referred to as a voltage-controlled amplifier), and a plurality of first analog-to-digital converters (ADCs) 112.

In some embodiments, the CTLE circuit 108 is a linear filter that can correct for losses and distortions caused by high frequency transmission lines. For example, the CTLE circuit 108 can be configured to receive the input signal 104, attenuate low-frequency signal components of the input signal 104, amplify components of the input signal 104 around the Nyquist frequency, and filter off higher frequencies of the input signal 104.

In some embodiments, the VGA 110 is an electronic amplifier that can vary its gain in response to a control voltage. For example, the VGA 110 can be configured as a signal-conditioning amplifier with an electronically settable voltage gain. Input(s) of the VGA 110 is/are coupled to output(s) of the CTLE circuit 108. For example, the CTLE circuit 108 and the VGA 110 can be coupled together using one or more electrical connections. Non-limiting examples of electrical connections include opto-isolators, pads, traces, wires, and vias.

In some embodiments, the first ADCs 112 are configured to convert the input signal 104, or portion(s) thereof, into a digital signal 124 (identified by D0[m:0], D1[m:0], . . . Dn[m:0]). For example, the first ADCs 112 can be configured to receive a continuous electrical signal and output a discontinuous electrical signal, such as one or more electrical pulses, to represent a sample of the continuous electrical signal. Respective input(s) of the first ADCs 112 is/are coupled to output(s) of the VGA 110.

The data receiver system 100 includes a retimer circuit 114 to recover (e.g., fully recover) the data represented by the input signal 104, extract an embedded clock in the input signal 104, and transmit a copy of the data using a new clock to the analog-assisted feed-forward equalizer 102. In some embodiments, the new clock is different from the embedded clock such that the retimer circuit 114 can transmit a fresh copy of the data using a clock free of distortion and/or interference. Input(s) of the retimer circuit 114 is/are coupled to respective output(s) of the first ADCs 112.

The analog-assisted feed-forward equalizer 102 of the illustrated example includes a plurality of digital-to-analog converters (DACs) 116, an analog addition circuit 118, and a second ADC 120. Respective input(s) of the DACs 116 is/are coupled to output(s) of the retimer circuit 114. Output (s) of the DACs 116 is/are coupled to the analog addition circuit 118. Output(s) of the analog addition circuit 118 is/are coupled to input(s) of the second ADC 120. Output(s) of the second ADC 120 is/are configured to be coupled to additional circuitry. For example, the second ADC 120 can output a sample 122 of the input signal 104 to one or more programmable processors. Non-limiting examples of programmable processors include central processing units (CPUs), digital signal processors (DSPs), and field programmable gate arrays (FPGAs).

In some embodiments, the DACs 116 are charge element DACs. For example, the DACs 116 can be implemented using a plurality of charge storage elements to store first samples of charge based on first portions of the digital signal that are output from the ADCs 112. Non-limiting examples of charge storage elements include capacitors, resistors, transformers, and transistors. In some embodiments, the DACs 116 can be configured to generate analog output signals proportional to the first portions of the digital signal and based on the samples of charge.

By way of example, a first one of the first ADCs 112 can convert the input signal 104 to the digital signal 124, such as a signal that represents one or more bits. In some embodiments, digital bits, such as the one or more bits represented by the digital signal 124, can have a value of 0 or a voltage reference (VREF) to represent the binary values 0 or 1, respectively. The digital signal of the illustrated example can be D0[m:0], D1[m:0], . . . , and/or Dn[m:0] of which n and m can be integers. For example, D0[2:0] can represent a first digital word having 3 bits (e.g., bit 0, bit 1, bit 2). For example, the first one of the first ADCs 112 can convert the input signal 104 to a 3-bit digital signal (but any other number of bits is contemplated). The retimer circuit 114 can retransmit a fresh copy of the 3-bit digital signal with a different clock than the clock embedded in the input signal 104. A first one of the DACs 116 can perform a multiplication operation on the 3-bit digital signal in the analog domain. For example, the first one of the DACs 116 can carry out a coarse step multiplication operation by shifting a position of the bits of the 3-bit digital signal using analog circuitry as disclosed herein. In some embodiments, the first one of the DACs 116 can carry out a fine step multiplication operation by changing a reference voltage (VREF) 126 of the first one of the DACs 116 using analog circuitry as disclosed herein.

Furthering the example, the first one of the DACs 116 can perform a coarse and/or a fine step multiplication operation on the 3-bit digital signal to generate a first analog signal (e.g., an analog output signal) and output the first analog signal to the analog addition circuit 118. In some embodiments, the analog addition circuit 118 can output a second analog signal based on a combination (e.g., a sum, a summation, a subtraction) of the first analog signal and other analog signal(s) that is/are output from the other one(s) of the DACs 116. For example, the analog addition circuit 118 can sum the output(s) of the DACs 116 using analog circuitry. The analog addition circuit 118 can output the second analog signal to the second ADC 120. The second ADC 120 can convert the second analog signal to a digital signal such that the digital signal can implement the sample 122 of the input signal 104.

Beneficially, the analog-assisted feed-forward equalizer 102 can be configured to cancel and/or otherwise reduce ISI associated with the input signal 104. In some embodiments, the analog-assisted feed-forward equalizer 102 can be configured to provide programmability to interface with different communication channels implemented by the receiver front end 106.

Beneficially, the analog-assisted feed-forward equalizer 102 can move multiplication and addition operations previously carried out using digital logic in conventional, digital feed-forward equalizers to the analog domain to achieve reduced latency, area consumption, and power consumption with respect to digital feed-forward equalizers. For example, the DACs 116 can perform multiplication operations substantially in parallel using analog circuitry whereas digital feed-forward equalizers perform multiplication operations using sequential operation. By performing multiplication operations substantially in parallel, the analog-assisted feed-forward equalizer 102 can generate samples with reduced latency when compared to digital feed-forward equalizers. Further, the implementation of at least part of the analog-assisted feed-forward equalizer 102 in the analog domain can reduce the power and area (e.g., area of an integrated circuit (IC) or chip, a printed circuit board (PCB), etc.) consumed by the analog-assisted feed-forward equalizer 102.

Figure 2:
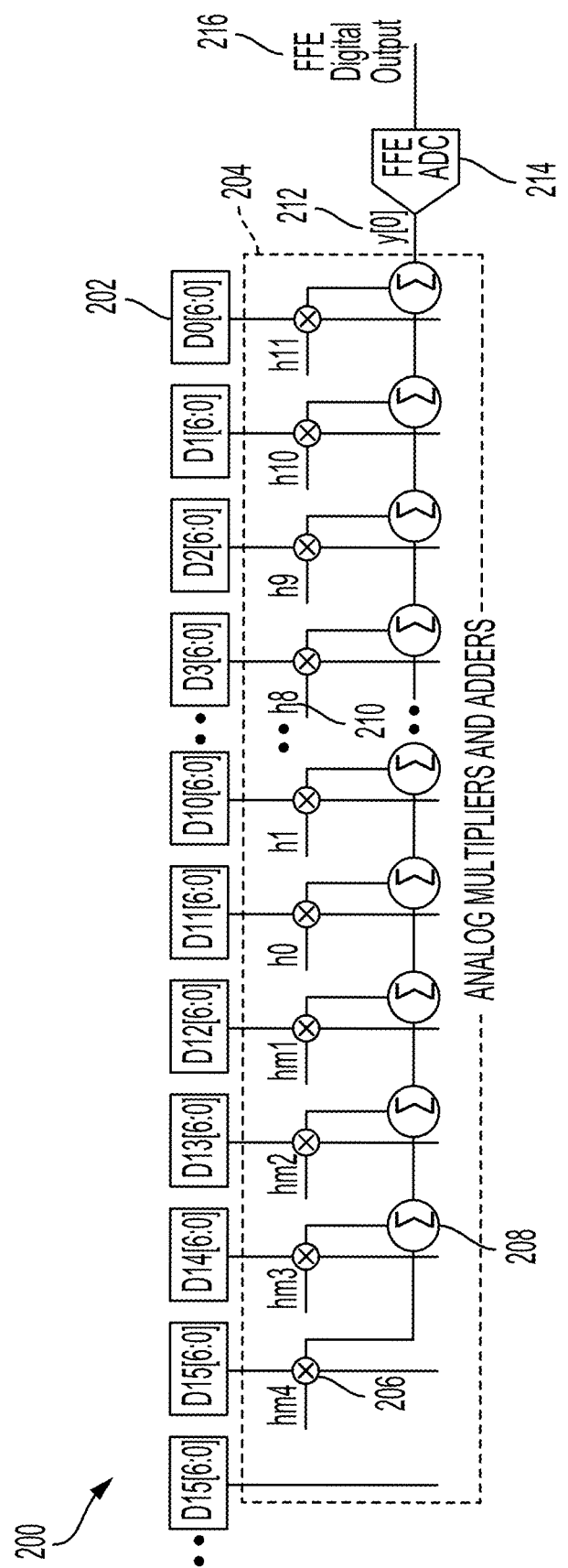
FIG. 2 depicts an example implementation of the analog-assisted feed-forward equalizer of FIG. 1.

FIG. 2 depicts an example analog-assisted feed-forward equalizer 200. In some embodiments, the analog-assisted feed-forward equalizer 200 can correspond to and/or implement the analog-assisted feed-forward equalizer 102 of FIG. 1. The analog-assisted feed-forward equalizer 200 of the illustrated example can be configured to receive digital signals 202. The digital signals 202 in this example are represented by digital words (e.g., D0[6:0], D1[6:0], . . . D15[6:0]). For example, the digital word D0[6:0] can represent a digital signal using 7 bits. Alternatively, one(s) of the digital signals 202 of this example may be represented by a different number of bits.

The analog-assisted feed-forward equalizer 200 of this example includes analog circuitry 204. The analog circuitry 204 includes a plurality of analog multipliers 206, such as analog multiplier circuits, and a plurality of analog adders 208, such as analog adder circuits. For example, the analog multipliers 206 can respectively implement a multiplication operation of one of the digital signals 202 and one of a plurality of coefficients 210 (identified by h0, h1, h2, etc.). For example, the coefficients 210 can be implemented by a configuration of the analog multipliers 206 to output an analog signal.

In the illustrated example, output(s) of the analog multipliers 206 is/are coupled to input(s) of the analog adders 208. In some embodiments, the analog adders 208 are implemented by a plurality of adder circuits. In some embodiments, the analog adders 208 are implemented by a single adder circuit and/or, more generally, adder circuitry. The analog adders 208 of the illustrated example generate a sample 212 (identified by y[0]) based on a combination (e.g., a sum, a summation, a subtraction) of the outputs of the analog multipliers 206.

The sample 212 of the illustrated example is output to a feed-forward equalizer (or feed-forward equalization) analog-to-digital converter (FFE ADC) 214. The FFE ADC 214 can convert an analog signal, such as the sample 212, into a digital output 216 (identified by FFE Digital Output). The digital output 216 can be provided to other circuitry, such as one or more programmable processors to effectuate an electrical and/or computing task.

Beneficially, analog-assisted feed-forward equalizers as disclosed herein, such as the analog-assisted feed-forward equalizer 200 of FIG. 2, can achieve reduced ADC conversion latency with respect to conventional equalizers. By way of example, a conventional main path FFE for a 112 gigabit per second (gbps) system may be implemented with 32 taps implemented using digital logic. In some conventional implementations, 8 of the 32 taps may have 7-bit inputs and 24 of the 32 taps may have 4-bit inputs. To complete the ADC conversion with the 32 digitally implemented taps, the total latency can be three time periods (3T) (e.g., three clock cycles) or approximately 3.43 nanoseconds (ns) (e.g., ~3.43 ns=3*(128/112 gbps) of which 128 is calculated by $2^7$ for the 7-bit inputs). Beneficially, to implement a conventional main path FFE with analog multipliers and adders disclosed herein, which can be operated to perform simultaneous multiplication and addition operations, the total latency can be one time period (1T) (e.g., one clock cycle) or approximately 1.14 ns (e.g., ~1.14 ns=1*(128/112 gbps), which is an approximate three-fold improvement in latency.

Figure 3:
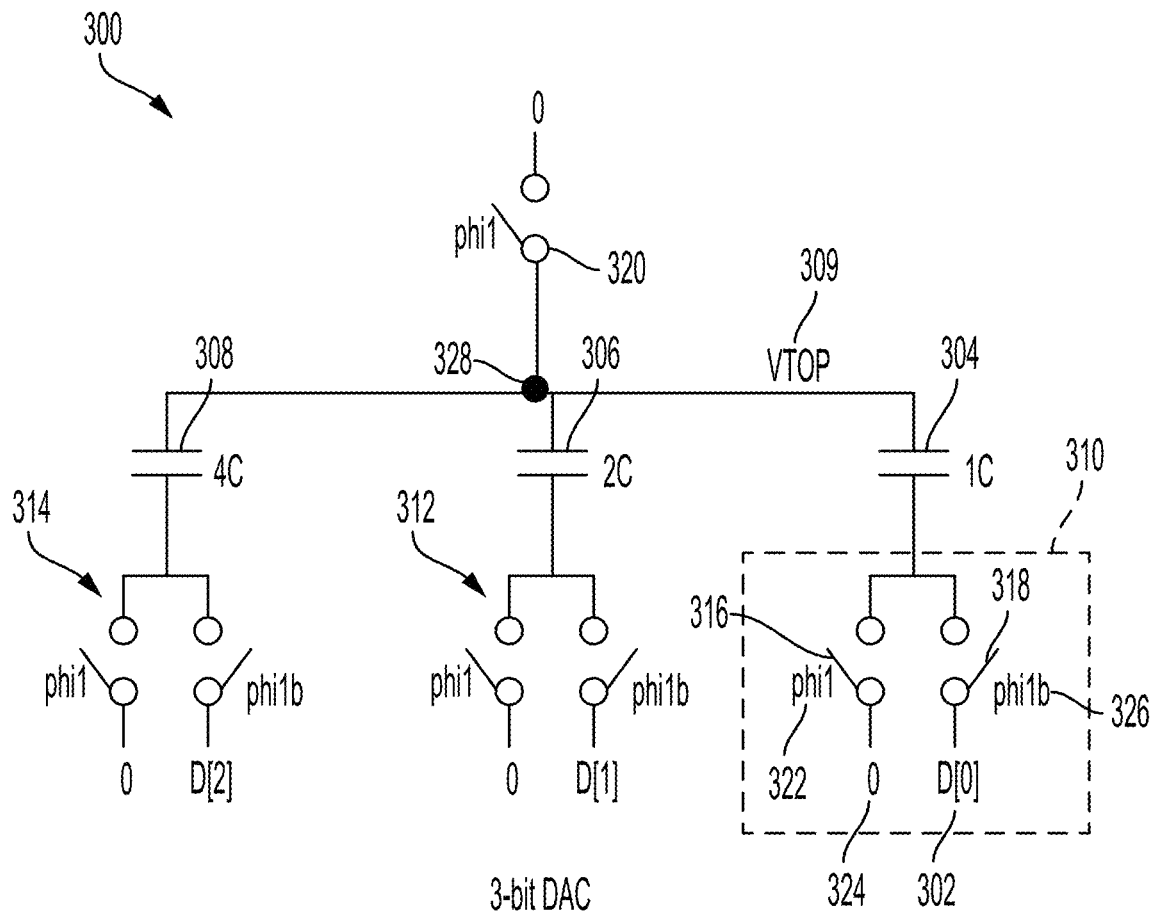
FIG. 3 depicts an example implementation of the digital-to-analog converter of FIG. 1.

FIG. 3 depicts an example multi-bit DAC 300. In some embodiments, the multi-bit DAC 300 can correspond to and/or implement one of the plurality of DACs 116 of FIG. 1. In some embodiments, the multi-bit DAC 300 can correspond to and/or implement one of the analog multipliers 206 and one(s) of the analog adders 208 of FIG. 2. The multi-bit DAC 300 of the illustrated example is a 3-bit DAC. Alternatively, the multi-bit DAC 300 may be implemented to represent an input signal 302 using any number of bits (e.g., 2 bits, 4 bits, 7 bits, etc.). For example, the input signal 302 can correspond to and/or implement one of the digital signals 124 of FIG. 1 and/or the digital signals 202 of FIG. 2.

The multi-bit DAC 300 of the illustrated example is a charge element DAC (CDAC) that includes a plurality of charge storage elements 304, 306, 308 to store first samples of charge based on portions of the input signal 302. The charge element DAC can generate an analog output signal 309 (identified by VTOP) that is proportional to the portions of the input signal 302 and based on the samples of charge. For example, the equivalent capacitance that is established after the first samples of charge are stored can correspond to a coefficient of a filter implemented by the multi-bit DAC 300.

The charge storage elements 304, 306, 308 of the illustrated example are capacitors coupled together in parallel. Alternatively, one or more of the charge storage elements 304, 306, 308 may be a different type of discrete electrical component such as a resistor, a transformer, or a transistor. The charge storage elements 304, 306, 308 each have a different storage capacity. For example, a first charge storage element 304 of the charge storage elements 304, 306, 308 has a first capacitance (identified by 1C), a second charge storage element 306 of the charge storage elements 304, 306, 308 has a second capacitance (identified by 2C), and a third charge storage element 308 of the charge storage elements 304, 306, 308 has a third capacitance (identified by 3C). For example, the second capacitance of the second charge storage element 306 can be twice as large as the first capacitance of the first charge storage element 304.

The multi-bit DAC 300 of the illustrated example includes a plurality of switch circuits 310, 312, 314 coupled to respective ones of the charge elements 304, 306, 308. The switch circuits 310, 312, 314 respectively include a first switch 316 and a second switch 318 coupled to a first plate (e.g., a bottom plate) of a respective one of the charge storage elements 304, 306, 308. The multi-bit DAC 300 also includes a third switch 320 coupled to second plates (e.g., top plates) of the charge storage elements 304, 306, 308.

In some embodiments, the first switch 316, the second switch 318, and/or the third switch 320 is/are implemented by one or more transistors. Non-limiting examples of transistors include a field-effect transistor (FET), a bipolar junction transistor (BJT) (e.g., an NPN BJT, a PNP BJT), and an insulated-gate bipolar transistor (IGBT). Non-limiting examples of FETs include power FETs and metal-oxide-semiconductor field-effect transistors (MOSFETs) (e.g., p-channel MOSFETs, n-channel MOSFETs, etc.). Any other type of transistor is contemplated.

In example operation, a first clock signal 322 (identified by phi1), which can be a control signal, can be asserted to close the first switches 316 and the third switch 320 to reset the multi-bit DAC 300. For example, during phi1, both the top and bottom plates of the charge storage elements 304, 306, 308 are discharged and/or otherwise reduced to a reference voltage 324, which is 0 V in this example (any other reference voltage may be used).

In example operation, a second clock signal 326 (identified by phi2) can be asserted and the first clock signal 322 can be de-asserted. For example, the first clock signal 322 and the second clock signal 326 can be complementary signals that alternate in magnitude and/or polarity. In response to the de-assertion of the first clock signal 322, the first switches 316 and the third switch 320 can be opened. In response to the assertion of the second clock signal 326, the second switches 318 can be closed. In example operation, the bottom plates of the charge storage elements 304, 306, 308 are coupled to either a logic high signal (e.g., VDD, VREF) or a logic low signal (e.g., 0 V) according to the digital word. Due to charge distribution, the top plates of the charge storage elements 304, 306, 308 can generate the analog output signal 309 to be a voltage that is a ratio of the logic high signal proportional to the digital word, which is described in connection with FIG. 4. For example, the multi-bit DAC 300 of FIG. 3 can perform multiplication operations by adjusting, changing, and/or otherwise scaling VREF that may be used to represent a logic high signal for the input signal 302. In example operation, a first output of associated with the first charge storage element 304 and a second output associated with the second charge storage element 306 are coupled at a node 328 at which the first and second outputs are combined (e.g., added, subtracted) to generate the analog output signal 309.

Figure 4:
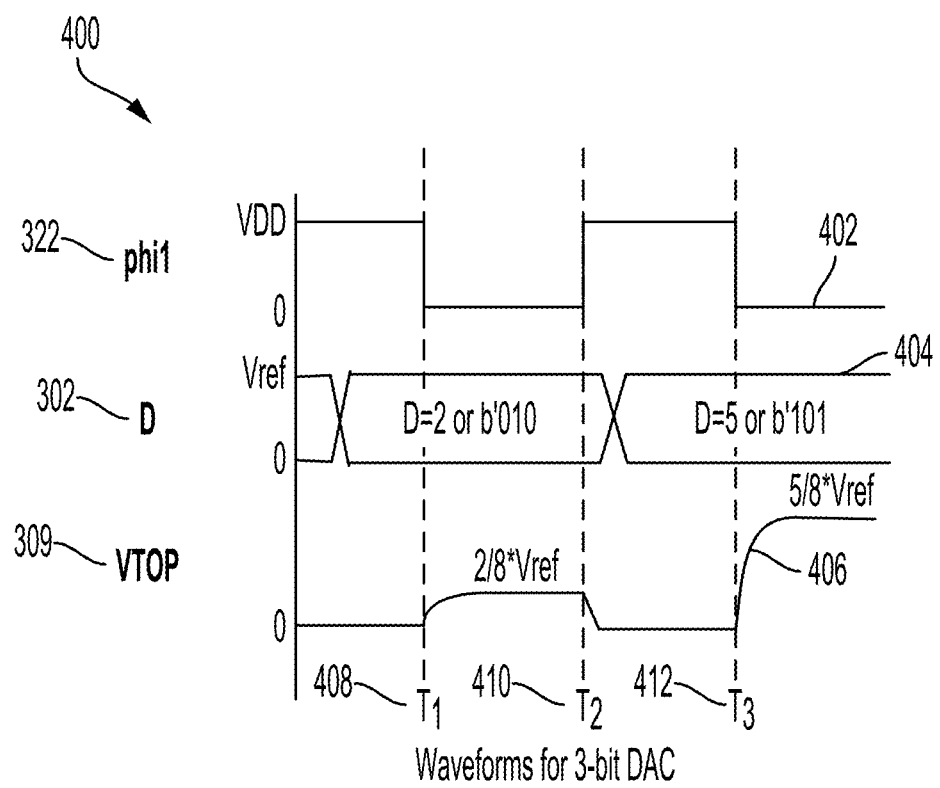
FIG. 4 is a timing diagram representative of example operation of the digital-to-analog converter of FIG. 3.

FIG. 4 is a timing diagram 400 representative of example operation of the multi-bit DAC 300 of FIG. 3. The timing diagram 400 depicts exemplary waveforms 402, 404, 406 of the first clock signal 322, the input signal 302, and the analog output signal 309 of FIG. 3, respectively. The x-axis of the timing diagram 400 is time and the y-axis of the timing diagram 400 is voltage (V). For example, the timing diagram 400 can depict the multi-bit DAC 300 performing multiplication operation(s) to generate the analog output signal 309 as a proportion of the input signal 302. The first waveform 402 alternates between a logic low signal, which is 0 V in this example, and a logic high signal, which is VDD in this example. The second waveform 404 can represent the value of the input signal 302 as a digital word.

By way of example, prior to a first time 408 (identified by $T_1$), the first clock signal 322 is asserted to VDD, which closes the first switches 316 and the third switch 320 of FIG. 3 to reset the output of the multi-bit DAC 300, such as the analog output signal 309, to 0. At the first time 408, the first clock signal 322 is de-asserted (and the second clock signal 326 is thereby asserted) to cause the first switches 316 and the third switch 320 to open and the second switches 318 of FIG. 3 to close. At the first time 408, the digital word to be sampled that is represented by the input signal 302 is D=2 or 010 in binary (identified as b'010). In some embodiments, when D=2, then, in FIG. 3, D[0]=0, D[1]=1, and D[2]=0 and causes a logic low signal, a logic high signal, and a logic low signal to be applied to the bottom plates of the charge storage elements 304, 306, 308, respectively. In this example, the analog output signal 309 is ⅔*VREF and thereby is a voltage that is proportional to VREF due to charge distribution and the equivalent capacitance of the charge storage elements 304, 306, 308. For example, the analog output signal 309 can be generated as an effective multiplication of VREF by a coefficient, such as ⅔ (or 0.25 or ¼). In this example, the multi-bit DAC 300 of FIG. 3 can perform multiplication operations corresponding to fine gain steps by scaling VREF. For example, the analog output signal 309 can be ⅔*VREF or a different value when VREF is scaled higher or lower to achieve a different fine gain multiplication step.

At a second time 410 (identified by $T_2$), the multi-bit DAC 300 is reset in response to the assertion of the first clock signal 322 and the de-assertion of the second clock signal 326. For example, the analog output signal 309 is reduced and approaches towards 0 V.

At a third time 412 (identified by $T_3$), the digital word to be sampled that is represented by the input signal 302 is D=5 or 101 in binary (identified as b'101). In some embodiments, when D=5, then, in FIG. 3, D[0]=1, D[1]=0, and D[2]=1 and causes a logic high signal, a logic low signal, and a logic high signal to be applied to the bottom plates of the charge storage elements 304, 306, 308, respectively. In this example, the analog output signal 309 is ⅝*VREF and thereby is a voltage that is proportional to VREF due to charge distribution and the equivalent capacitance of the charge storage elements 304, 306, 308. For example, the analog output signal 309 can be generated as an effective multiplication of VREF by a coefficient, such as ⅝ (or 0.625).

Figure 5:
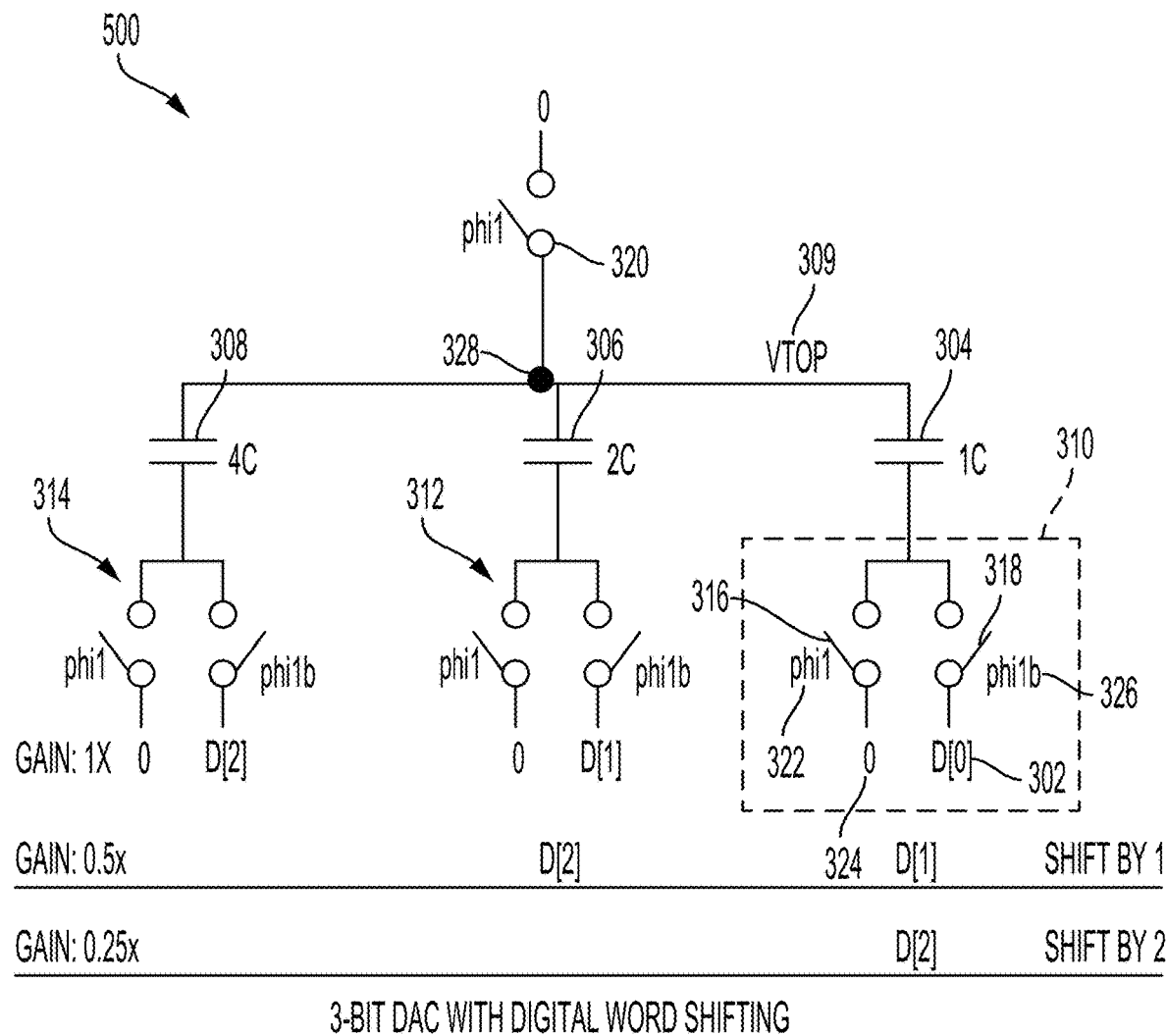
FIG. 5 depicts another example implementation of the digital-to-analog converter of FIG. 1.

FIG. 5 depicts another example multi-bit DAC 500. In some embodiments, the multi-bit DAC 500 can correspond to and/or implement one of the plurality of DACs 116 of FIG. 1. In some embodiments, the multi-bit DAC 500 of FIG. 5 can correspond to and/or implement one of the analog multipliers 206 and one(s) of the analog adders 208 of FIG. 2. The multi-bit DAC 500 of the illustrated example is a 3-bit DAC that can implement digital word shifting. Alternatively, the multi-bit DAC 5000 may be implemented to represent the input signal 302 of FIG. 3 using any number of bits (e.g., 2 bits, 4 bits, 7 bits, etc.).

The multi-bit DAC 500 of the illustrated example includes the charge storage elements 304, 306, 308, the switch circuits 310, 312, 314, the first switches 316, the second switches 318, and the third switch 320 of FIG. 3. Further depicted is the analog output signal 309, the reference voltage 324, and the node 328 of FIG. 3.

The multi-bit DAC 500 of this example can perform multiplication (or multiplier) operations using reference voltage scaling and/or digital word shifting. For example, the multi-bit DAC 500 can carry out coarse gain steps by shifting the digital words by one position, two positions, etc. By way of example, a unity coarse gain step can be implemented without bit shifting. By way of another example, a 0.5× gain step can be implemented by shifting the bits of the digital word represented by the input signal 302 by one position such that D[2] is provided to the second switch circuit 312 and D[1] is provided to the first switch circuit 310. By way of yet another example, a 0.25× gain step can be implemented by shifting the bits of the digital word represented by the input signal 302 by two positions such that D[2] is provided to the first switch circuit 310 and D[1] and D[0] are not connected. In some embodiments, the multi-bit DAC 300 of FIG. 3 can perform multiplication operations using digital word shifting as disclosed herein.

Additionally or alternatively, the multi-bit DAC 500 can perform multiplication (or multiplier) operations using voltage scaling (e.g., reference voltage scaling). For example, the multi-bit DAC 500 can carry out fine gain steps by scaling VREF (e.g., the reference voltage 126 of FIG. 1). For example, the multi-bit DAC 500 can scale the voltage that represents the logic high signal of the input signal 302.

FIG. 6 is a table 600 of example coefficients (identified by Ctot). For example, the coefficients can correspond to the weights of a filter (e.g., a high-pass filter, a low-pass filter, a bandpass filter, etc.) implemented by an analog-assisted feed-forward equalizer as disclosed herein. In some such examples, the coefficients can be implemented using a total capacitance (and/or equivalent capacitance) of a charge element DAC, such as the total capacitance of the charge storage elements 304, 306, 308 of FIG. 3.

In some embodiments, the coefficients can be implemented by an analog-assisted feed-forward equalizer as disclosed herein, such as the analog-assisted feed-forward equalizer 102 of FIG. 1 and/or the analog-assisted feed-forward equalizer 200 of FIG. 2. For example, the coefficients in the table 600 can correspond to the coefficients (e.g., h0, h1, etc., hm1, hm2, etc.) of FIG. 2.

In some embodiments, the table 600 corresponds to a DAC transfer function. For example, the coefficients in the table 600 can be implemented by analog multipliers as disclosed herein. For example, the coefficients can be implemented by the plurality of DACs 116 of FIG. 1, the multipliers 206 of FIG. 2, the multi-bit DAC 300 of FIG. 3, and/or the multi-bit DAC 500 of FIG. 5.

The DAC transfer function represented by the table 600 of FIG. 6 is an example of an 11-bit coefficient multiplier for a 7-bit representation of data. For example, the rows of the table 600 can represent 7 steps of shift multiplication, which can implement coarse gain steps (identified by Ctrim Coarse). For n shift, the gain is $2^{-n}$ from 1 to $2^{-6}$. For example, shifting the digital word by one in FIG. 5 can correspond to a shift from 1 (e.g., Coeff15) to 0.5 (e.g., Coeff31) in the table 600 of FIG. 6.

The columns of the table 600 can represent reference voltage scaling (e.g., VREF scaling), which can implement fine gain steps (identified by Trim Fine). For reference control (or reference code) R from 0 to 15, VREF can be determined based on the example of Equation (1) below:

$$VREF = \frac{R+17}{32},\qquad\text{Equation (1)}$$

In the example of Equation (1) above, VREF levels from VREF to VREF*($17/32$). Accordingly, the coefficient multiplier value can be determined based on the example of Equation (2) below:

$$\text{Coefficient multiplier value} = 2^{-n} * \left(\frac{R+17}{32}\right),\qquad\text{Equation (2)}$$

In the example of Equation (2) above, n is the number of shifts and R is the reference code from 0 to 15.

Figure 7:
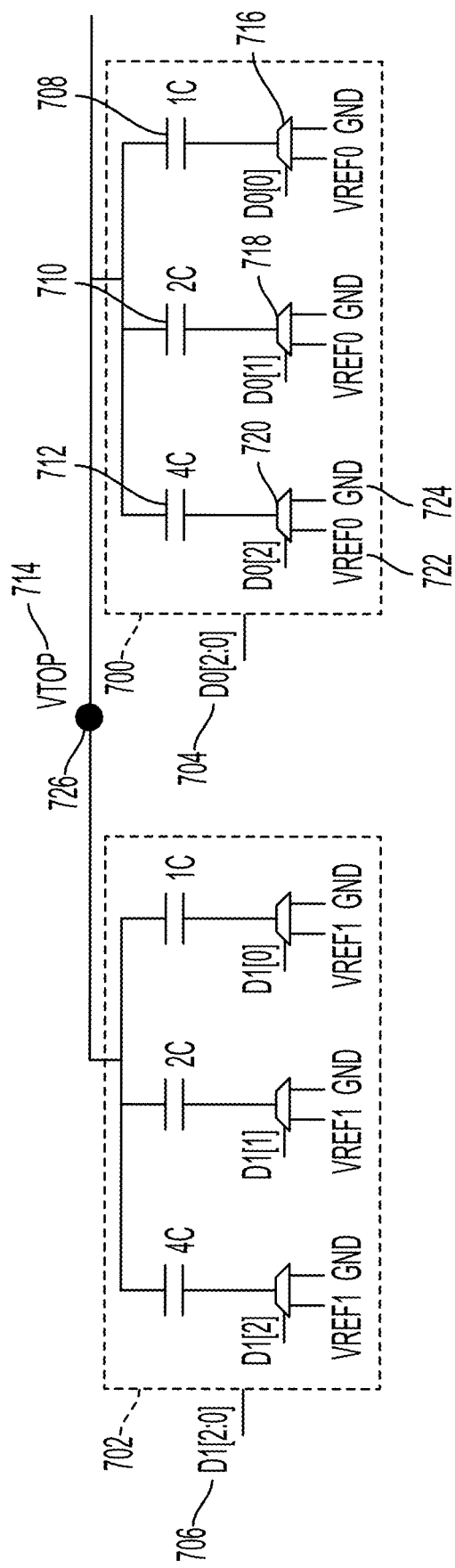
FIG. 7 depicts yet another example implementation of the digital-to-analog converter of FIG. 1.

FIG. 7 depicts a first example multi-bit DAC 700 and a second example multi-bit DAC 702. In some embodiments, the first multi-bit DAC 700 can correspond to and/or implement one(s) of the DACs 116 of FIG. 1. In some embodiments, the second multi-bit DAC 702 can correspond to and/or implement one(s) of the DACs 116 of FIG. 1. In some embodiments, the first multi-bit DAC 700 can correspond to and/or implement a first one of the DACs 116 and the second multi-bit DAC 702 can correspond to and/or implement a second one of the DACs 116.

The multi-bit DACs 700, 702 of this example are 3-bit DACs. For example, the multi-bit DACs 700, 702 can be configured to convert digital words 704, 706 (identified by D0[2:0] and D1[2:0]) into 3-bit analog representations. Alternatively, the first multi-bit DAC 700 and/or the second multi-bit DAC 702 may represent digital signals using a different number of bits.

In some embodiments, each of the multi-bit DACs 700, 702 can represent a tap of an analog-assisted feed-forward equalizer, such as the analog-assisted feed-forward equalizer 102 of FIG. 1 and/or the analog-assisted feed forward equalizer 200 of FIG. 2. In some embodiments, each of the multi-bit DACs 700, 702 can be configured to set its own multiplier coefficient and/or be set by external control circuitry. Non-limiting examples of external control circuitry include a programmable processor and a hardware-implemented state machine. In some embodiments, the first multi-bit DAC 700 can perform shift and/or reference voltage scaling separately and/or independently from the shifting and/or reference voltage scaling of the second multi-bit DAC 702.

The multi-bit DACs 700, 702 of this example respectively include a plurality of charge storage elements 708, 710, 712 to store charge samples of charge based on portion(s), such as bit(s), of the digital words 704, 706. The charge storage elements 708, 710, 712 can be configured to generate an analog output signal 714 (identified by VTOP) at a node 726 and that is proportional to the portion(s) of the digital words 704, 706 and based on the stored samples of charge. The charge storage elements 708, 710, 712 of the illustrated example are capacitors coupled in parallel. Alternatively, one or more of the charge storage elements 708, 710, 712 may be a different component, such as a resistor, a transistor, or an inductor. The charge storage elements 708, 710, 712 each have a different storage capacity. For example, first ones of the charge storage elements 708, 710, 712 have a capacitance of 1C, second ones of the charge storage elements 708, 710, 712 have a capacitance of 2C, and third ones of the charge storage elements 708, 710, 712 have a capacitance of 3C. Alternatively, one or more of the charge storage elements 708, 710, 712 may have a different storage capacity than depicted in this example.

The multi-bit DACs 700, 702 of this example respectively include a plurality of switch circuits 716, 718, 720. The switch circuits 716, 718, 720 are respectively coupled to the charge storage elements 708, 710, 712. For example, an output of a first switch circuit 716 of the switch circuits 716, 718, 720 is coupled to a first plate (e.g., a bottom plate) of a first charge storage element 708 of the charge storage elements 708, 710, 712. The switch circuits 716, 718, 720 of this example are implemented by one or more multiplexers (or multiplexer circuits). Alternatively, one or more of the switch circuits 716, 718, 720 may be implemented by one or more switches, one or more latches, one or more flip-flops, etc., and/or any combination(s) thereof. The switch circuits 716, 718, 720 can be configured to switch an output of the switch circuits 716, 718, 720 between a reference voltage 722 (identified by VREF0 or VREF1) and a ground voltage 724 (identified by GND). In this example, the first multi-bit DAC 700 is configured to use a first reference voltage (VREF1) and the second multi-bit DAC 702 is configured to use a second reference voltage (VREF2). In some embodiments, VREF1 and VREF2 are the same while they are different in other embodiments.

In the illustrated example, the analog output signal 714 can be generated based on a combination (e.g., a sum, a summation, a subtraction) of a first term associated with the first multi-bit DAC 700 and a second term associated with the second multi-bit DAC 702. For example, the analog output signal 714 can be generated based on the example of Equation (3) below:

$$VTOP = \\ VREF1*\left(D1[0]*\frac{1C}{14C}+D1[1]*\frac{2C}{14C}+D1[2]*\frac{4C}{14C}\right)+ \\ VREF0*\left(D0[0]*\frac{1C}{14C}+D0[1]*\frac{2C}{14C}+D0[2]*\frac{4C}{14C}\right),$$

Equation (3)

The example of Equation (3) above can be simplified and/or reduced to the example of Equation (4) below:

$$VTOP=(0.5*VREF1*D1)+(0.5*VREF0*D0),$$ Equation (4)

In example operation, the first multi-bit DAC 700 can receive the first digital word 704, which can have a value of D=2 or 010 in binary (e.g., b'010). Accordingly, D0[0] can be 0, D0[1] can be 1, and D0[2] can be 0, of which 0 can correspond to a logic low signal (e.g., the ground voltage 724) and 1 can correspond to a logic high signal (e.g., the reference voltage 722). In response to D0[0] being 0, the first switch circuit 716 selects the ground voltage 724 to be output to the first charge storage element 708. In response to D0[1] being 1, a second switch circuit 718 of the switch circuits 716, 718, 720 selects the reference voltage 722 to be output to a second charge storage element 710 of the charge storage elements 708, 710, 712. In response to D0[2] being 0, a third switch circuit 720 of the switch circuits 716, 718, 720 selects the ground voltage 724 to be output to a third charge storage element 712 of the charge storage elements 708, 710, 712.

In example operation, the second multi-bit DAC 700 can receive the second digital word 706, which can have a value of D=5 or 101 in binary (e.g., b'101). Accordingly, D1[0] can be 1, D1[1] can be 0, and D1[2] can be 1, of which 0 can correspond to a logic low signal (e.g., the ground voltage 724) and 1 can correspond to a logic high signal (e.g., the reference voltage 722). In response to D1[0] being 1, the first switch circuit 716 of the second multi-bit DAC 702 can select VREF1 to be output to the first charge storage element 708 of the second multi-bit DAC 702. In response to D1[1] being 0, the second switch circuit 718 of the second multi-bit DAC 702 can select the ground voltage 724 to be output to the second charge storage element 710 of the second multi-bit DAC 702. In response to D1[2] being 1, the third switch circuit 720 of the second multi-bit DAC 702 can select VREF1 to be output to the third charge storage element 712 of the second multi-bit DAC 702.

In example operation, the term (0.5*VREF*D0) in the example of Equation (4) above can be $\frac{1}{14}$*VREF (e.g., 0.5*VREF*(2C/14C)). In example operation, the term (0.5*VREF*D1) in the example of Equation (4) above can be $\frac{5}{14}$*VREF (e.g., 0.5*VREF*(5C/14C)). In example operation, the analog output signal 714 can be determined based on the combination (e.g., the sum, the summation, the subtraction) of $\frac{1}{14}$*VREF and $\frac{5}{14}$*VREF, which is $\frac{3}{7}$*VREF, due to charge redistribution and the equivalent capacitance of the charge storage elements 708, 710, 712. For example, a first analog output of $\frac{1}{14}$*VREF and a second analog output of $\frac{5}{14}$*VREF can be combined at the node 726 to generate and/or otherwise output the analog output signal 714.

Beneficially, since the first multi-bit DAC 700 and the second multi-bit DAC 702 perform multiplication and addition simultaneously (without sequential logic), the number of taps can be scaled up without affecting latency whereas in digital implementation more taps necessitates more gates in series and thereby increases latency.

Figure 8:
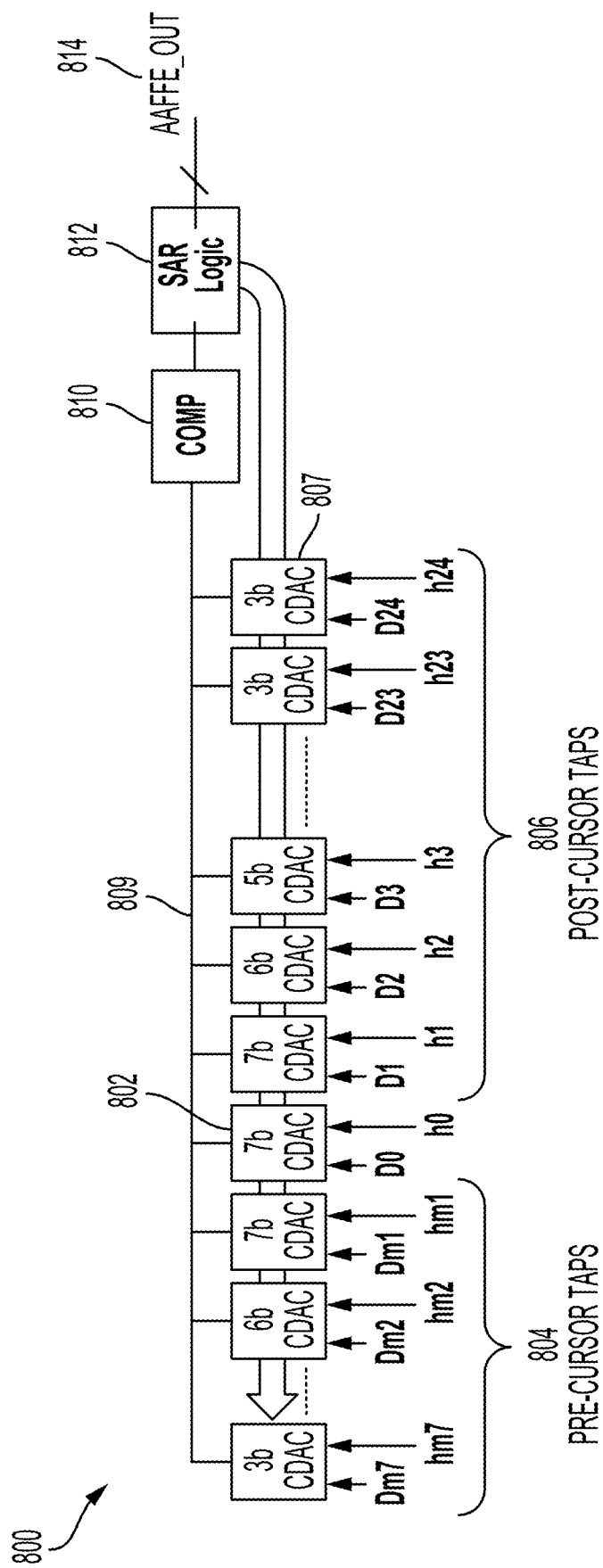
FIG. 8 depicts another example implementation of the analog-assisted feed-forward equalizer of FIG. 1.

FIG. 8 depicts another example analog-assisted feed-forward equalizer 800. In some embodiments, the analog-assisted feed-forward equalizer 800 can correspond to and/or implement the analog-assisted feed-forward equalizer 102 of FIG. 1 and/or the analog-assisted feed-forward equalizer 200 of FIG. 2.

The analog-assisted feed-forward equalizer 800 is an example of an FFE implementation with a main tap 802 (may also be referred to as a primary tap, a main cursor, or a primary cursor), 7 pre-cursor taps 804 and 24 post-cursor taps 806. The taps 802, 804, 806 of this example are respectively implemented by a CDAC 807, which can have a different number of bits depending on the type and/or position of the cursors. For example, the main tap 802 is a 7-bit CDAC. A second one of the pre-cursor taps 804 (identified by digital word Dm2 and coefficient hm2) is a 6-bit CDAC. A twenty-fourth one of the post-cursor taps 806 (identified by digital word D24 and coefficient h24) is a 3-bit CDAC. Alternatively, one or more of the taps 802, 804, 806 may be implemented by a CDAC with a different number of bits than shown in FIG. 8.

The analog-assisted feed-forward equalizer 800 of the illustrated example includes a comparator circuit 810 and a successive approximation (SAR) logic circuit 812. Output(s) of the taps 802, 804, 806 is/are coupled to input(s) of the comparator circuit 810. Output(s) of the comparator circuit 810 is/are coupled to input(s) of the SAR logic circuit 812.

Output(s) of the SAR logic circuit 812 is/are coupled to subsequent circuitry, which may include one or more programmable processors.

In example operation, the comparator circuit 810 can compare (e.g., repeatedly compare, iteratively compare) the output(s) of the taps 802, 804, 806, which are combined at one or more nodes 809, to a voltage threshold. The comparator circuit 810 can output a signal representative of the comparison to the SAR logic circuit 812. The SAR logic circuit 812 can convert a continuous analog waveform into a discrete digital representation using a binary search technique through all possible quantization levels before converging upon a digital output for each conversion and outputting the digital output as a digital code 814 (identified by AAFFE_OUT). For example, the output from the SAR logic 812 can be a digital signal (e.g., a digital output signal), a digital representation of an analog signal, etc. For example, for each bit, the SAR logic circuit 812 can output a binary code to the taps 802, 804, 806 that is dependent on the current bit under evaluation and the previous bits already approximated. The comparator circuit 810 can determine the state of the current bit under evaluation. After all bits have been approximated, the digital approximation is output at the end of the conversion as the digital code 814.

By way of example, the SAR logic circuit 812 can select a first bit for evaluation (e.g., a most-significant bit) and output a 7-bit binary code of 1000000 (or b'1000000) to the taps 802, 804, 806 such that bit 7 of each of the taps 802, 804, 806 is set to 1 (if the taps 802, 804, 806 are 7-bit taps) and 0 otherwise. The taps 802, 804, 806, using analog multipliers and adders as disclosed herein, generate an analog output signal for evaluation by the comparator circuit 810. The comparator circuit 810 can compare the analog output signal to a threshold voltage. If the output does not satisfy and/or is less than the threshold voltage, the comparator circuit 810 can output a signal representative of the same to the SAR logic circuit 812 and the SAR logic circuit 812 can approximate bit 7 as a logic low representation, such as 0.

After a determination that the analog output signal satisfies and/or is greater than the threshold voltage, the comparator circuit 810 can output a signal representative of the same to the SAR logic circuit 812. The SAR logic circuit 812 can approximate bit 7 as a logic high representation, such as 1. The SAR logic circuit 812 can cycle through the remaining bits to approximate the remainder of the 7-bit binary code and output the approximation as the digital code 814.

Figure 9:
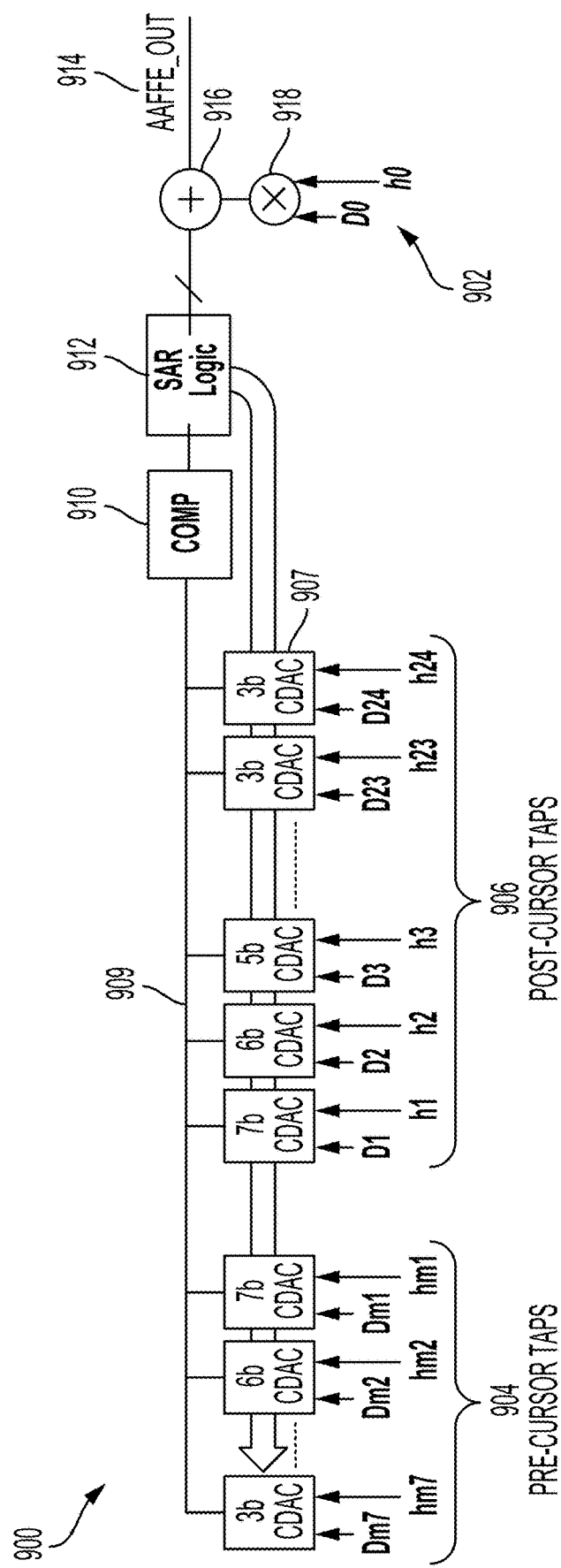
FIG. 9 depicts yet another example implementation of the analog-assisted feed-forward equalizer of FIG. 1.

FIG. 9 depicts yet another example analog-assisted feed-forward equalizer 900. In some embodiments, the analog-assisted feed-forward equalizer 900 can correspond to and/or implement the analog-assisted feed-forward equalizer 102 of FIG. 1 and/or the analog-assisted feed-forward equalizer 200 of FIG. 2.

The analog-assisted feed-forward equalizer 900 is an example of a hybrid approach to an analog-assisted FFE implementation with a main tap 902 implemented using digital logic and 7 pre-cursor taps 904 and 24 post-cursor taps 906 implemented in the analog domain. The pre-cursor taps 904 and the post-cursor taps 906 of this example are respectively implemented by a CDAC 907, which can have a different number of bits depending on the type and/or position of cursors. Alternatively, one or more of the pre-cursor taps 904 and/or the post-cursor taps 906 may be implemented by a CDAC with a different number of bits than shown in FIG. 9.

The analog-assisted feed-forward equalizer 900 of the illustrated example includes a comparator circuit 910 and an SAR logic circuit 912. In some embodiments, the comparator circuit 910 of FIG. 9 can correspond to and/or implement the comparator circuit 810 of FIG. 8. In some embodiments, the SAR logic circuit 912 of FIG. 9 can correspond to and/or implement the SAR logic circuit 812 of FIG. 8. Output(s) of the pre-cursor taps 904 and the post-cursor taps 904 is/are combined at one or more nodes 909. Output(s) of the pre-cursor taps 904 and the post-cursor taps 906 is/are coupled to input(s) of the comparator circuit 910. Output(s) of the comparator circuit 910 is/are coupled to input(s) of the SAR logic circuit 912. Output(s) of the SAR logic circuit 912 is/are coupled to subsequent circuitry, which may include one or more programmable processors. For example, the SAR logic circuit 912 can output an approximation of the input signal as a digital code 914 (identified by AAFFE-_OUT) to one or more programmable processors.

The analog-assisted feed-forward equalizer 900 of the illustrated example includes an adder circuit 916 to generate the digital code 914 based on a combination (e.g., a sum, a summation, a subtraction) of the approximation determination by the SAR logic circuit 912, which can be a first digital output, and an output of a multiplier circuit 918, which can be a second digital output. The multiplier circuit 918 can be configured to output an approximation of the main tap 902 as the second digital output.

Beneficially, by implementing the main tap 902 in the digital domain, a substantially large amplitude term is removed from the ADC conversion and can relax the FFE ADC area and range. In some embodiments, the gain block can be reused as the ADC gain calibration and/or control. Beneficially, the addition of the multiplier circuit 918 does not invoke a timing issue because the multiplier circuit 918 is evaluating the main tap 902 in parallel with the evaluation of the pre-cursor taps 904 and/or the post-cursor taps 906.

Figure 10:
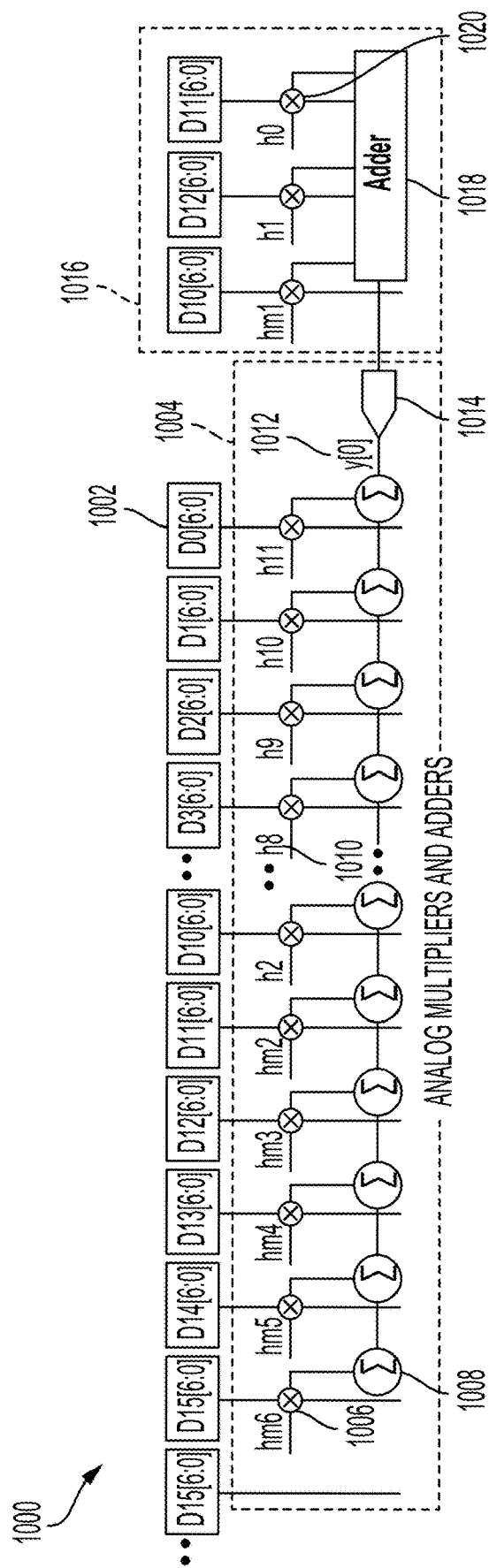
FIG. 10 depicts another example implementation of the analog-assisted feed-forward equalizer of FIG. 1.

FIG. 10 depicts another example analog-assisted feed-forward equalizer 1000. In some embodiments, the analog-assisted feed-forward equalizer 1000 can correspond to and/or implement the analog-assisted feed-forward equalizer 102 of FIG. 1. The analog-assisted feed-forward equalizer 1000 is another example of a hybrid approach to an analog-assisted FFE implementation with one or more taps implemented using digital logic and one or more taps implemented in the analog domain. The hybrid approach may be utilized to manage the trade-off(s) between analog and digital domain implementations. For example, implementing taps in the digital domain may achieve benefits such as reduced noise and implementing taps in the analog domain may achieve benefits such as reduced area, power consumption, and latency. By implementing one or more taps in the analog domain, such as tap(s) that are not associated with relatively large ADC magnitude terms, and implementing one or more taps in the digital domain, such as tap(s) that are associated with relatively large ADC magnitude terms, then reduced area, power consumption, and latency can be achieved with less impact from noise. Beneficially, the hybrid approach can achieve lower scale and thereby better quantization noise. Beneficially, the hybrid approach can yield smaller capacitors (as the larger magnitude terms may be implemented using digital logic instead of a plurality of capacitors and/or associated circuitry) which can achieve a smaller area than that achievable by a non-hybrid approach.

The analog-assisted feed-forward equalizer 1000 of the illustrated example can be configured to receive digital signals 1002. The digital signals 1002 in this example are represented by digital words (e.g., D0[6:0], D1[6:0], . . . D15[6:0]). For example, the digital word D0[6:0] can represent a digital signal using 7 bits. Alternatively, one(s) of the digital signals 1002 of this example may be represented by a different number of bits.

The analog-assisted feed-forward equalizer 1000 includes analog circuitry 1004, such as a plurality of analog multipliers 1006, such as analog multiplier circuits, and a plurality of analog adders 1008, such as analog adder circuits. For example, the analog multipliers 1006 can respectively implement a multiplication operation of one the digital signals 1002 and one of a plurality of coefficients 1010 (identified by h2, h3, hm2, etc.). For example, the coefficients 1010 can be implemented by a configuration of the analog multipliers 1006 to output an analog signal. In some embodiments, the coefficients 1010 can correspond to the coefficients in the table 600 of FIG. 6.

In the illustrated example, output(s) of the analog multipliers 1006 is/are coupled to input(s) of the analog adders 1008. In some embodiments, the analog adders 1008 are implemented by a plurality of adder circuits. In some embodiments, the analog adders 1008 are implemented by a single adder circuit and/or, more generally, adder circuitry. The analog adders 1008 of the illustrated example generate a sample 1012 (identified by y[0]) based on a combination (e.g., a sum, a summation, a subtraction) of the outputs of the analog multipliers 1006.

The sample 1012 of the illustrated example is output to an ADC 1014. The ADC 1014 can be configured to convert the sample 1012 from the analog domain to the digital domain. For example, the ADC 1014 can convert an analog representation of the sum of the analog multipliers 1006 into a digital representation. Output(s) of the ADC 1014 is/are coupled to input(s) of digital logic 1016. The digital logic 1016 of this example includes an adder circuit 1018 (e.g., an adder implemented by digital logic) and a plurality of multiplier circuits 1020 (e.g., a plurality of multiplier circuits implemented by digital logic). Output(s) of the multiplier circuits 1020 is/are coupled to the adder circuit 1018. The multiplier circuits 1020 can generate digital outputs based on respective multiplications of ones of the digital signals 1002 and corresponding ones of the coefficients 1010. The adder circuit 1018 can generate a digital output based on a combination (e.g., a sum, a summation, a subtraction) of the sample 1012 and the digital outputs from the multiplier circuits 1020. The adder circuit 1018 can provide the digital output to other circuitry, such as one or more programmable processors to effectuate an electrical and/or computing task. Beneficially, by implementing the larger ADC conversion terms, such as the main tap, in the digital domain, then they can be removed from the ADC conversion and achieve relaxation of the FFE ADC area and range.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. An apparatus for feed-forward equalization, comprising:
    a first charge element digital-to-analog converter (DAC) with a first output, the first charge element DAC comprising a first plurality of charge storage elements, the first charge element DAC being configured to:
        store first samples of charge based on respective first portions of a digital input signal; and
        generate a first analog output signal proportional to the first portions of the digital input signal and based on the first samples of charge; and
    a second charge element DAC with a second output coupled to the first output, the second charge element DAC comprising a second plurality of charge storage elements, the second charge element DAC being configured to:
        store second samples of charge based on respective second portions of the digital input signal; and
        generate a second analog output signal proportional to the second portions of the digital input signal and based on the second samples of charge; and wherein
    the first output and the second output are coupled at a node to combine the first analog output signal and the second analog output signal to generate a third analog output signal.

2. The apparatus of claim 1, wherein the first charge element DAC has a first input, the second charge element DAC has a second input, the first input is configured to be coupled to a third output of a retimer circuit associated with a receiver, and the second input is configured to be coupled to the third output or a fourth output of the retimer circuit.

3. The apparatus of claim 1, wherein the first charge element DAC comprises:
    a multiplier circuit configured to generate the first analog output signal based on a multiplication of a reference voltage and a coefficient; and
    an adder circuit configured to generate the third analog output signal based on a combination of outputs of the multiplier circuit.

4. The apparatus of claim 3, wherein the multiplier circuit is configured to at least one of:
    scale the reference voltage; or
    shift an input at which the first portions of the digital input signal is to be provided.

5. The apparatus of claim 1, wherein the first charge element DAC comprises:
    a first switch circuit coupled to a first charge element; and
    a second switch circuit coupled to a second charge element, the second charge element coupled to the first charge element.

6. The apparatus of claim 5, wherein at least one of the first charge element or the second charge element is a capacitor.

7. The apparatus of claim 5, wherein the first charge element is a first capacitor with a first capacitance and the second charge element is a second capacitor with a second capacitance, different from the first capacitance.

8. The apparatus of claim 5, wherein the first switch circuit comprises:
    a first switch configured to receive a first voltage representative of a first bit of the digital input signal; and
    a second switch configured to receive a reference voltage.

9. The apparatus of claim 8, wherein:
    the first switch is turned on at a first time to charge the first charge element to a first voltage;
    the second switch is turned off at the first time;
    the first switch is turned off at a second time, after the first time; and
    the second switch is turned on at the second time to discharge the first charge element.

10. The apparatus of claim 1, wherein the first charge element DAC comprises:
    a first multiplexer coupled to a first charge element; and
    a second multiplexer coupled to a second charge element, the second charge element coupled to the first charge element.

11. The apparatus of claim 10, wherein:
    the first multiplexer is configured to select a first voltage when a first bit of the digital input signal is a logic high signal; and
    the first multiplexer is configured to select a second voltage when the first bit of the digital input signal is a logic low signal, the second voltage less than the first voltage.

12. The apparatus of claim 10, wherein the second charge element DAC comprises:
    a third charge element coupled in parallel to the first charge element and the second charge element; and
    a fourth charge element coupled in parallel to the first charge element, the second charge element, and the third charge element.

13. The apparatus of claim 1, further comprising:
    a comparator circuit with a comparator input and a comparator output, the comparator input coupled to the first output and the second output; and
    a successive approximation (SAR) circuit with a SAR input and a SAR output, the SAR input coupled to the comparator output.

14. The apparatus of claim 13, wherein the SAR circuit is to output a first digital output signal, and the apparatus further comprising:
    a multiplier circuit with a multiplier input and a multiplier output, the multiplier input configured to multiply third portions of the digital input signal and a coefficient using digital logic to generate a second digital output signal; and
    an adder circuit with a first adder input coupled to the SAR output and a second adder input coupled to the multiplier output, the adder circuit configured to output a sample of the digital input signal based on a combination of the first digital output signal and the second digital output signal.

15. An apparatus comprising:
    a plurality of capacitor digital-to-analog converters (CDACs) with respective CDAC outputs, the plurality of CDACs configured to generate first analog output signals proportional to first portions of a digital input signal;

a comparator circuit with a comparator input and a comparator output, the comparator input coupled to one or more of the respective CDAC outputs, the comparator circuit configured to determine whether respective ones of the first analog output signals satisfy a voltage threshold;

successive approximation (SAR) logic with a SAR logic input and a SAR logic output, the SAR logic input coupled to the comparator output, the SAR logic configured to pass the comparator output and control sampling of the plurality of CDACs;

digital logic with a digital logic output, the digital logic configured to generate a second analog output signal representative of a multiplication of second portions of the digital input signal and a coefficient; and an adder circuit with a first adder input and a second adder input, the first adder input coupled to the SAR logic output, the second adder input coupled to the digital logic output, and the adder circuit configured to output a sample of the digital input signal based on a combination of the first analog output signal and the second analog output signal.

16. The apparatus of claim 15, wherein the digital logic is configured to receive a main cursor of the digital input signal.

17. The apparatus of claim 16, wherein a first one of the plurality of CDACs is configured to sample ones of the first portions of the digital input signal based on a first number of bits, and the digital logic is to sample the main cursor based on a second number of bits, greater than the first number of bits.

18. The apparatus of claim 15, wherein the coefficient is a first coefficient, and the digital logic is configured to generate a third analog output signal representative of a multiplication of third portions of the digital input signal and a second coefficient.

19. An apparatus comprising:

a receiver front end circuit configured to convert a first analog signal to a digital signal, the first analog signal associated with a first clock;

a retimer circuit coupled to the receiver front end circuit, the retimer circuit configured to output a copy of the digital signal based on a second clock, different from the first clock;

a plurality of capacitor digital-to-analog converters (CDACs) coupled to the retimer circuit, the plurality of CDACs configured to generate second analog signals proportional to portions of the digital signal;

analog adder circuitry configured to generate a third analog signal based on a combination of ones of the second analog signals; and an analog-to-digital converter configured to output a sample of the digital signal based on the third analog signal.

20. The apparatus of claim 19, wherein the combination is a first combination, the analog-to-digital converter includes digital logic configured to generate a fourth analog signal representative of a multiplication of second portions of the digital signal and a coefficient, and the sample is based on a second combination of the third analog signal and the fourth analog signal.

* * * * *